(12) United States Patent  
Bargroff et al.

(10) Patent No.: US 7,558,551 B2
(45) Date of Patent: Jul. 7, 2009

(54) SIGNAL DISTRIBUTION SYSTEM CASCADABLE AGC DEVICE AND METHOD

(75) Inventors: Keith Bargroff, San Diego, CA (US); Dale Hancock, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 42 days.

(21) Appl. No.: 11/538,627

(22) Filed: Oct. 4, 2006

(65) Prior Publication Data

US 2007/0141982 A1   Jun. 21, 2007

Related U.S. Application Data

(63) Continuation of application No. 10/734,603, filed on Dec. 11, 2003, now abandoned.

(60) Provisional application No. 60/433,066, filed on Dec. 11, 2002, provisional application No. 60/433,061, filed on Dec. 11, 2002, provisional application No. 60/433,067, filed on Dec. 11, 2002, provisional application No. 60/433,063, filed on Dec. 11, 2002.

(51) Int. Cl.
 *H04B 1/06* (2006.01)
(52) U.S. Cl. .............. 455/234.1; 455/241.1; 455/245.2; 455/3.02
(58) Field of Classification Search ................ 455/3.02, 455/232.1, 234.1, 234.2, 241.1, 245.2
See application file for complete search history.

(56) References Cited

U.S. PATENT DOCUMENTS

| 4,345,251 A | 8/1982 | Begeman et al. |
| 4,705,967 A | 11/1987 | Vasile |
| 4,931,802 A | 6/1990 | Assal et al. |
| 4,953,184 A | 8/1990 | Simone |
| 5,073,930 A * | 12/1991 | Green et al. .................. 725/69 |

(Continued)

FOREIGN PATENT DOCUMENTS

DE   201 03 220 U   6/2001

(Continued)

OTHER PUBLICATIONS

Courtesy copy of International Search Report for PCT/US03/39678 dated Jun. 21, 2004.

(Continued)

*Primary Examiner*—Lana N Le
(74) *Attorney, Agent, or Firm*—Clifford Perry; Bruce W. Greenhaus

(57) ABSTRACT

A cascadable AGC amplifier in a signal distribution system includes a low noise cascadable amplifier having a through path and a cascadable output. The cascadable amplifier is also configured to provide AGC over a predetermined input power range. The cascadable AGC amplifier can be configured to provide gain or attenuation. When the cascadable AGC amplifier is implemented in a signal distribution system, typically as part of a signal distribution device, an input signal can be gain controlled and supplied to multiple signal paths without distortion due to degradation of signal to noise ratio or distortion due to higher order amplifier products. The distributed signal is not significantly degraded by distortion regardless of the number of cascadable AGC amplifiers connected in series or the position of the cascadable AGC amplifier in the signal distribution system.

3 Claims, 6 Drawing Sheets

U.S. PATENT DOCUMENTS

| | | |
|---|---|---|
| 5,184,084 A | 2/1993 | Yun |
| 5,220,419 A | 6/1993 | Sklar |
| 5,278,837 A | 1/1994 | Kelley |
| 5,285,284 A | 2/1994 | Takashima et al. |
| 5,319,673 A | 6/1994 | Briskman |
| 5,339,454 A | 8/1994 | Kuo |
| 5,608,724 A | 3/1997 | Green, Jr. |
| 5,654,774 A | 8/1997 | Pugel et al. |
| 5,715,532 A | 2/1998 | Sagawa et al. |
| 5,852,662 A | 12/1998 | Forgues |
| 5,881,369 A | 3/1999 | Dean et al. |
| 5,929,895 A | 7/1999 | Barry et al. |
| 6,005,861 A | 12/1999 | Humpleman |
| 6,072,994 A | 6/2000 | Phillips et al. |
| 6,295,282 B1 | 9/2001 | Buer et al. |
| 6,353,463 B1 | 3/2002 | Seo |
| 6,377,783 B1 * | 4/2002 | Lo et al. ............ 455/101 |
| 6,408,164 B1 | 6/2002 | Lazaris-Brunner et al. |
| 6,417,733 B1 | 7/2002 | Corsi et al. |
| 6,434,374 B1 | 8/2002 | Mutterspaugh |
| 6,437,837 B1 | 8/2002 | Seo |
| 6,498,926 B1 * | 12/2002 | Ciccarelli et al. ........ 455/240.1 |
| 6,509,777 B2 | 1/2003 | Razavi et al. |
| 6,510,185 B2 | 1/2003 | Lee |
| 6,584,304 B1 | 6/2003 | Thomsen et al. |
| 6,882,834 B1 | 4/2005 | Balboni |
| 6,987,958 B1 | 1/2006 | Lo et al. |
| 7,088,975 B1 * | 8/2006 | Gomez et al. ............ 455/232.1 |
| 2003/0190900 A1 | 10/2003 | Yasuda et al. |
| 2004/0203337 A1 | 10/2004 | Ammar |

FOREIGN PATENT DOCUMENTS

| | | |
|---|---|---|
| EP | 0 757 489 | 2/1996 |
| EP | 1 009 113 | 6/2000 |
| WO | WO 97/49240 | 12/1997 |
| WO | WO 99/43104 | 8/1999 |
| WO | WO 00/22735 | 4/2000 |
| WO | WO 02/082671 | 10/2002 |

OTHER PUBLICATIONS

Courtesy copy of International Search Report for PCT/US03/39741 dated Jun. 21, 2004.

Courtesy copy of International Search Report for PCT/US03/39677 dated Sep. 23, 2004.

"Information for Installers of Hot Bird™ DVB-S Systems," Version 1.0, Jun. 7, 1999.

"Digital Satellite Equipment Control (DiSEqC™), Update and Recommendations for Implementation," Version 2.0, Apr. 18, 1997.

Kwentus et al., "A Single-Chip Universal Digital Satellite Receiver with 480-MHz IF Input," Nov. 1999, IEEE J. of S.S. Circ., vol. 34, No. 11, pp. 1634-1646.

Datasheet for Philips Semiconductors UAA3202M Frequency Shift Keying (FSK) Receiver, Aug. 1997.

"RCA DIRECTV™ Receiver with UltimateTV® Service Setup Guide," 2000.

* cited by examiner

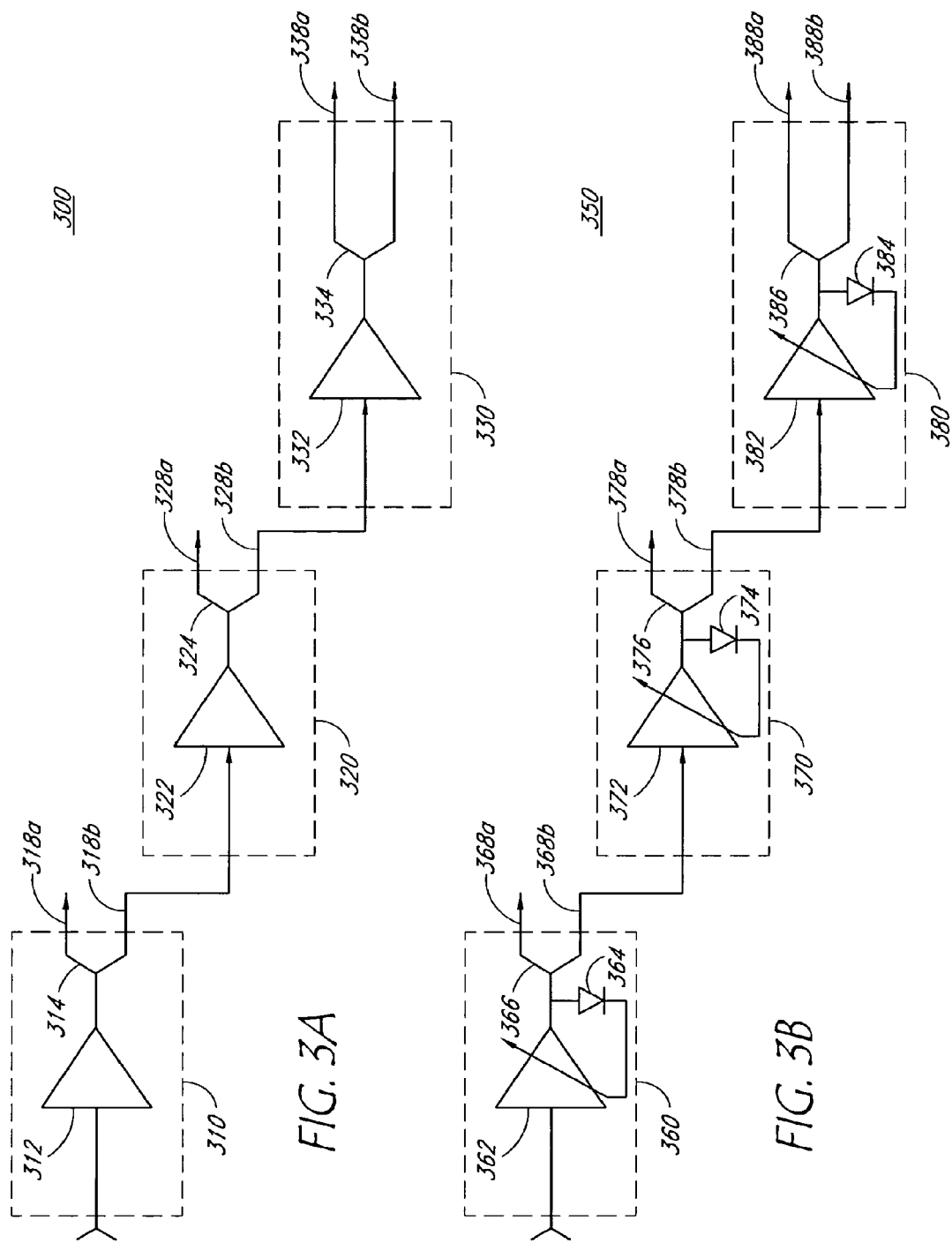

SIGNAL DISTRIBUTION SYSTEM CASCADABLE AGC DEVICE AND METHOD

PRIORITY APPLICATIONS

This application is a continuation of U.S. patent application Ser. No. 10/734,603, incorporated herein by reference, said parent U.S. application Ser. No. 10/734,603 claiming priority to, and incorporating by reference in their entirety, the following patent applications:

U.S. Provisional Patent Application No. 60/433,066, filed on Dec. 11, 2002, entitled INTEGRATED CROSSPOINT SWITCH WITH BAND TRANSLATION;

U.S. Provisional Patent Application No. 60/433,061, filed on Dec. 11, 2002, entitled IN-LINE CASCADABLE DEVICE IN SIGNAL DISTRIBUTION SYSTEM WITH AGC FUNCTION;

U.S. Provisional Patent Application No. 60/433,067, filed on Dec. 11, 2002, entitled N×M CROSSPOINT SWITCH WITH BAND TRANSLATION;

U.S. Provisional Patent Application No. 60/433,063, filed on Dec. 11, 2002, entitled MIXER WITH PASS-THROUGH MODE WITH CONSTANT EVEN ORDER GENERATION.

BACKGROUND OF THE INVENTION

1. Field of the Invention

The invention relates to the field of electronic communications. More particularly, the invention relates to the field of Radio Frequency (RF) signal distribution.

2. Description of the Related Art

Signal distribution systems, such as RF signal distribution systems, typically are arranged in branched configurations. In a branched configuration, the signal typically originates at the center, or trunk, and the signal is distributed from the point of origin to the multiple end points of the branches. Each distribution branch from the trunk can be split into one or more smaller branches. Additionally, the smaller branches themselves may divide into even smaller branches one or more times prior to reaching a destination.

An RF communications signal distributed along a system is typically amplified several times along the various signal distribution paths prior to reaching a device at a destination. However, various factors operate to degrade the quality of the original signal prior to its reaching a device at a destination.

The quality of a signal is often measured as a ratio of the signal power to the noise power, referred to as signal-to-noise ratio (SNR). The signal power can be defined as the power of the portion of the signal that contains the desired information. The noise power can be defined as the combination of the random fluctuations that are uncorrelated to the information power and the undesired distortion products. The undesired distortion products can be defined to be those signal components that do not replicate the original information. Although the noise power is here used to mean the combination of the uncorrelated signals with the distortion products, other noise definitions can be used to gauge the signal quality. For example, the noise power can be represented by only the uncorrelated signals, or the noise can be represented by the uncorrelated signals and some of the distortion products.

The signal to noise ratio (SNR) typically measures the ratio of the signal to the noise and distortion experienced by the signal. Thermal noise is often a large contributor to the noise power in systems that use received radio waves as the signal source. The thermal noise level often represents the noise floor that cannot be further reduced through the use of active or passive devices. Passive losses, through passive signal division or attenuation, reduce the signal power but typically do not reduce the level of thermal noise. As such, signal attenuation can result in degradation of SNR.

Signal amplification can be used to offset some of the effects of attenuation in a signal distribution system. However, active devices, such as amplifiers, do not provide signal gain without affecting the noise and distortion that degrade the signal quality. For example, amplifiers typically introduce uncorrelated noise into the signal that further degrades the SNR. Some of the amplifier noise contribution is quantified as an amplifier noise figure, which may also be expressed as a noise factor. An amplifier's noise figure may directly contribute to signal degradation and degradation of SNR when the system operates in low power conditions close to the noise floor as is typical in a system using received RF signals.

Additionally, an amplifier may contribute distortion products that degrade the SNR. One prevalent amplifier distortion product that often contributes to in-band noise in wideband or multi-channel distribution systems is a third order intermodulation distortion product. The level of third order intermodulation distortion contributed by a particular amplifier is typically predicted based on an amplifier characteristic known as the third order intercept (IP3). The third order intercept represents a fictional operating point at which the amplifier third order distortion products would be equal in amplitude to the desired signal component. A higher amplifier IP3 is desirable. However, amplifier IP3 often correlates with amplifier power consumption. Thus, an amplifier with a high IP3 typically consumes more power than an amplifier having a lower IP3. Amplifier power consumption is of great concern because of constraints on power dissipation as well as constraints on the ability to dissipate the heat that is associated with higher power devices. Additionally, amplifiers that have low noise figures often have correspondingly low IP3.

A device, whether passive or active, can typically be designed to operate within one particular set of signal parameters at a particular location within a signal distribution system. However, signal parameters within particular location in a signal distribution system often change radically based on the number of branches before or after the device and the number of passive and active devices. placed before or after a device. Thus, a device that is optimized for one set of operating parameters may be a dominant noise source in another set of signal parameters.

What is desirable is a device and method of signal distribution that is invariant to changes in signal powers and distribution system configurations. Additionally, it is typically desirable for the device to minimize its degradation of SNR under many operating conditions. The device should also allow for the creation of numerous branches in the signal distribution path, with the inclusion or deletion of signal branches having minimal affect on other branches of the signal distribution system.

SUMMARY OF THE INVENTION

An AGC amplifier and a method of distributing signals in a signal distribution system are disclosed. The AGC amplifier uses a power detector and feedback to a control input of a variable gain amplifier to maintain the output power of the variable gain amplifier at a predetermined AGC setpoint. The detector can be connected to the output of the variable gain amplifier to provide an output referred AGC function. The AGC setpoint can be chosen to be a signal power within an optimal operating range of the signal distribution system.

The output of the AGC amplifier can be connected to an in-line signal path and can also be connected to a cascade output. The cascade output allows a single AGC amplifier to provide the AGC function for two signal paths. The noise contribution is minimized for devices connected in cascade with the AGC amplifier. Another AGC amplifier having an in-line path and a cascade output can be connected in series with the cascade output of a first AGC amplifier to generate additional signal paths.

The AGC amplifier can be implemented within an integrated circuit, which may include additional elements. The integrated circuit can include a crosspoint switch in series with the in-line signal path output of the AGC amplifier. The integrated circuit can also include a band translation device in series with the in-line signal path output of the AGC amplifier.

The AGC amplifier and signal distribution method can be implemented in a satellite television distribution system where the signals are received as satellite downlink signals and are distributed to multiple locations within a building, such as a residence. Alternatively, the AGC amplifier and signal distribution method can be implemented in a cable television, cable radio, terrestrial television, terrestrial radio, telephone, or data distribution system.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein:

FIGS. 3A-3B are finctional block diagrams of cascaded amplifier configurations.

DETAILED DESCRIPTION OF THE PREFERRED EMBOBIMENT

Signal distribution systems are typically used to link together geographically remote parts of a communication system. Often, a centralized point exists from which the signals originate, or branch. The signal distribution system can be used to provide a signal of interest to one or more devices at one or more geographic locations.

Figure 1:
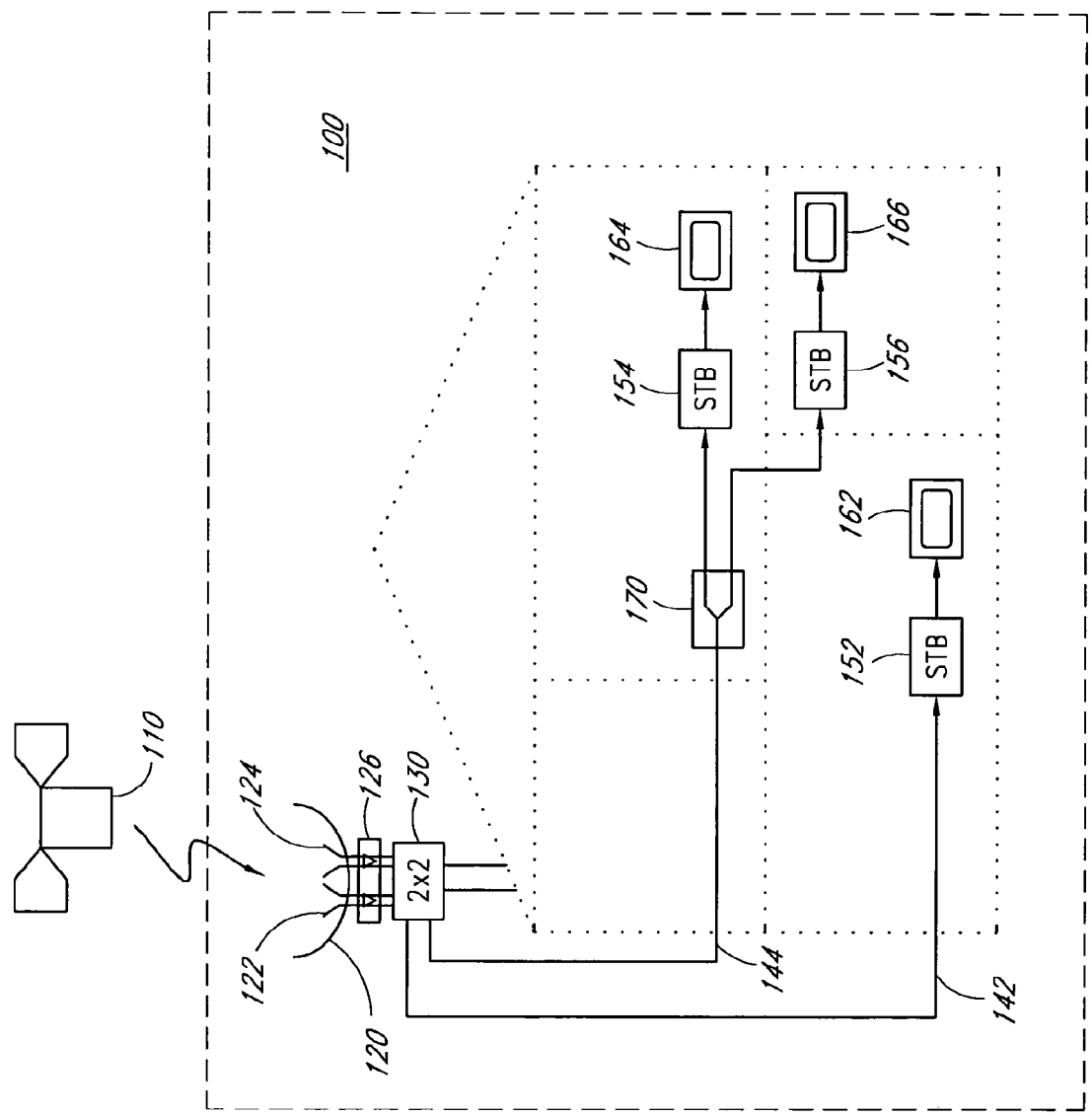
FIG. 1 is a finctional block diagram of a signal distribution system configured to receive signals from satellites and distribute them to multiple user devices.

FIG. 1 is a functional block diagram of a signal distribution system 100 that is typical of a satellite television system that can be implemented at a residence or other building. The signal distribution system 100 includes an antenna 120 having antenna feeds 122, 124 coupled to two inputs of a low noise block 126. The outputs of the low noise block 126 are coupled to two inputs of a distribution switch 130. The distribution switch outputs are connected to first, second, and third set top boxes 152, 154, 156, using first and second transmission lines 142, 144. The output of the first set top box 152 is connected to a first output device 162. A signal splitter 170 splits into two signals the signal coupled from the distribution switch 130 by the second transmission line 144. A first signal splitter 170 output is coupled to the second set top box 154 and the second signal splitter 170 output is coupled to the third set top box 156. The output of the second set top box 154 is connected to a second output device 164 and the output of the third set top box 156 is connected to a third output device 166.

The antenna 120 includes two antenna feeds 122, 124. However, multiple antennae can be used. Additionally, each antenna 120 can have one or more antenna feeds 122, 124, and each antenna 120 is not limited to having only two feeds 122, 124. Alternatively, the antenna 120 can be a configuration that does not utilize an antenna feed, such as a whip or horn.

The antenna 120 receives one or more signals from a satellite 110. Additionally, the satellite 110 can provide a signal of a particular polarization and modulation type. Again, there may be more than one satellite 110 providing signals to the antenna 120. The signals from a particular satellite 110 can be in the same frequency band as signals from another satellite (not shown) or can be in distinct frequency bands. The signals from multiple satellites can each have the same polarity and modulation type or can be different from each other.

In the signal distribution system 100 of FIG. 1, each of the antenna feeds 122, 124 is connected to an independent input of a low noise block 126 that outputs signals to the distribution switch 130. Of course, the distribution switch 130 is not limited to a 2×2 switch but can have any number of input ports and output ports, for example, the distribution switch 130 can be, for example, a 2×4 switch, a 4×4 switch, or some other switch arrangement.

The distribution switch 130 is configured to process the received satellite signals. The distribution switch 130 can, for example, amplify, filter, and frequency downconvert the received satellite signals. The distribution switch 130 can be configured as a pair of low noise block converters (LNB's) that each block convert the signals from one of the distribution switch 130 inputs to an intermediate frequency. The distribution switch 130 can also be configured to allow each of the input signals provided to the inputs to be connected to any one of multiple switch outputs. Thus, the signal provided from the first antenna feed 122 can be block converted in the distribution switch 130 and routed to any of the switch outputs. Similarly, the signal provided from the second antenna feed 124 can be block converted in the distribution switch 130 and routed to any of the switch outputs. Typically, the distribution switch 130 is configured such that the signals from only one signal source are routed to a particular switch output. Alternatively, one or more of the block converted signals can be routed to the same distribution switch 130 output.

The outputs of the distribution switch 130 can be connected to remote locations using cabling when the antenna 120 and distribution switch 130 are installed in a geographically remote location from the desired signal destinations. The outputs of the distribution switch 130 are typically routed to remote destinations with transmission lines, which can be coaxial cables. The distribution switch 130 can be positioned local to the low noise block 126 and antenna feeds 122 and 124, or may be positioned remote from the low noise block 126 and antenna feeds 122 and 124.

In one embodiment, the distribution switch 130 is co-located with the antenna 120, low noise block 126, and antenna feeds 122 and 124. In another embodiment, the distribution switch 130 can be located remote from the antenna 120. For example, cables or transmission lines can couple the signals from the low noise block 126 to a distribution switch 130 positioned inside a structure near one or more set top boxes 152 and 154. Similarly, in other embodiments, the distribution switch 130 can be positioned in an intermediate location between the antenna 120 and the set top boxes 152 and 154. In some embodiments, the low noise block 126 is omitted and signals from the antenna feeds 122 and 124 can be coupled to the distribution switch 130 using cables. Similarly, output signals from the distribution switch 130 can be coupled to set top boxes or other destination devices using cables or some other distribution system.

In a first embodiment, the distribution switch is positioned local to the low noise block 126 and antenna 120. A first transmission line 142 distributes the signal from the first output port of the distribution switch 130 to a remote location within the signal distribution system 100. The end of the first transmission line 142 is connected to a first set top box 152 located remote from the distribution switch 130.

A second transmission line 144 distributes the signal from the second output port of the distribution switch 130 to a signal splitter 170. A first output of the signal splitter 170 is coupled to the second set top box 154. The second set top box 154 can be located at a location remote from the distribution switch 130 and signal splitter 170 and can also be at a location remote from the first set top box 152. A second output of the signal splitter 170 is coupled to a third set top box 156. The output of the third set top box 156 is coupled to a third output device 166.

The first and second transmission lines, 142 and 144, can be parallel lines, twisted pairs, coaxial line, waveguide, and the like, or any other means for distributing the signal. Additionally, although transmission lines are typically used to minimize signal loss and signal reflections, the system can use other means for distributing the signal that are not transmission lines. For example, wires, wire bundles, and the like, can be used for distributing the signals from the distribution switch 130 to the set top boxes 152, 154. However, for signals that can be considered Radio Frequency (RF) signals, the signals are typically distributed using transmission lines. The RF information signals can, for example, be in the range of KHz up to several GHz. Of course, the signal distribution system 100 is not limited to distributing RF signals, but can distribute other signals, such as baseband signals or optical signals.

The transmission lines 142, 144, are typically non-ideal passive devices. Thus, the transmission lines attenuate the signal power. However, the attenuation contributed by the transmission lines 142, 144 typically do not attenuate the noise power to the same degree as the signal power. For example, a passive attenuator, such as a length of transmission line may not significantly degrade the thermal noise. Additionally, the transmission lines 142, 144 can contribute other types of cable related signal degradation. For example, the transmission lines can affect flatness, tilt, phase distortion, group delay distortion, reflection, interference, noise pick-up and microphonic noise of the distributed signals. Thus, the losses contributed by the transmission lines 142, 144 typically degrade the SNR of the signal distributed to the set top boxes 152, 154.

The first and second transmission lines 142 and 144 are coupled to corresponding inputs of set top boxes 152, 154, and 156. The second transmission line 144 couples to the second and third set top boxes, 154 and 156, via the signal splitter 170. In one embodiment, the frequency bands for the signals output from the distribution switch 130 do not correspond to frequency bands used by the output devices 162 and 164. Thus, the set top boxes 152, 154 can further frequency translate the signals to operating bands compatible with the output devices 162, 164, and 166. Additionally, the output signals from the distribution switch 130 can be in a format that is not compatible with the format used by the output devices 162, 164, and 166. The set top boxes 152, 154, and 156 can then function as signal processing stages. For example, the satellite downlink signals can be digitally modulated in a format that is not compatible with the output devices 162, 164, and 166 which can be typical television receivers. The set top boxes 152, 154, and 156 can be configured to demodulate the digitally modulated signals, process the demodulated signals, and then modulate television channel carrier frequencies with the signals for delivery to the television output devices 162, 164, and 166.

Alternatively, if the signals output from the distribution switch 130 are in a format and are at a frequency band that is compatible with the output devices 162, 164, and 166 the set top boxes 152, 154, and 156 may not be required. In still another alternative, one or more of the functions performed by the set top boxes 152, 154, and 156 can be integrated into the output devices 162, 164, 166. In still another embodiment, the signal splitter 170 can be configured to perform signal processing, such as frequency conversion or demodulation.

In the embodiment described in FIG. 1, each of the set top boxes 152, 154, and 156 is connected to a single output device 162, 164, and 166. However, more than one output device e.g. 162, 164 can be connected to the output from a single set top box, for example 152. Alternatively, outputs from more than one set top box 152, 154, and 156 can be combined or otherwise connected to a single output device, for example 162, although such a configuration is not typical.

An output device, for example 162, can be configured to tune to a particular channel within the one or more frequency bands provided by the set top box, such as 152. The output device 162 can process the signal from the selected channel to present some media content, such as video or audio, to a user.

For example, the output devices, 162, 164, and 166 can be television receivers and can display a television signal corresponding to a signal transmitted by the satellite 110. The output devices 162, 164, and 166 can be other types of devices in other signal distribution systems. For example the output devices 162, 164, and 166 can be telephones, radio receivers, computers, networked devices, and the like, or other means for outputting a signal.

The output devices 162, 164, and 166 can have a range of signal quality over which the output is considered acceptable. For example, the output devices 162, 164, and 166 can provide acceptable outputs for input SNR above a predetermined level, which may represent a desired minimum SNR. However, the SNR at the input to the output devices, 162, 164, and 166 is typically determined by the signal processing performed in the set top boxes 152, 154 and 156. Thus, the signal quality is typically related to the signal quality at the input of the set top boxes 152, 154, and 156. Thus, the signal distribution system 100 is typically configured to provide a signal at the input to the set top boxes 152, 154, and 156 having a SNR greater than the desired minimum.

Although FIG. 1 is a functional block diagram of a satellite signal distribution system, other signal distribution systems have similar structures. For example, cable distribution systems, which may distribute television, radio, data, and/or telephony signals, typically provide a single access point to a geographic area, such as a residence. The signal from the one access point is then typically split, amplified, distributed, and can be combined with other signals, such as, for example the satellite television signals. Communication systems having wireless communication links can also have similar structures. For example, a terrestrial television or radio system can include a single antenna and distribute the signals received at the single antenna to multiple output devices using a signal distribution system 100 that can amplify, split, distribute, and/or combine the received signals.

The signal distribution system is not limited to a residence, but can span many residences, businesses, or locations not associated with dwellings or buildings. The signal distribution system is characterized by its features and is not limited to any particular application.

Additionally, although FIG. 1 shows only the signal splitter 170 interposed between the distribution switch 130 and set top boxes 154 and 156, elements other than the transmission lines 142, 144, and signal splitter 170 can be interposed between the distribution switch 130 and the set top boxes 152, 154, and 156. The additional distribution devices can include active or passive power dividers, active or passive power combiners, amplifiers, attenuators, filters, switches, cross-point switches, multiplexers, de-multiplexers, frequency translation devices, encoders, decoders, and the like or any other means for distributing a signal. Each of these additional signal distribution devices can contribute to the noise experienced by the distributed signal.

For example, a two-way passive power divider allows a signal at one input to be split equally into two output signals, each having half the original signal power, while maintaining an impedance match at all ports. An ideal two-way passive divider reduces the SNR by 3 dB. However, in practice, the degradation is often higher.

Active signal distribution devices can contribute to signal degradation, for example by generating distortion products that degrade SNR. The distortion contributed by an active device typically increases as the input signal power to the device increases. Additionally, the location of an active device within the signal distribution system 100 can affect the impact that the device has on SNR. An active device located at an input to the signal distribution system can experience a larger signal power, and thus degrade the SNR more than an identical device located at a the end of a transmission line, e.g. 142, where the signal power can be significantly attenuated.

Because the distortion typically increases at a rate greater than the rate of increase in signal power, the SNR degrades for input signals that are large in relation to the device capabilities. A large input signal can be defined as a signal that generates a predetermined level of distortion in an active device. For example, a signal can be large when measured in relation to the input signal level required to generate a 1 dB amplifier output compression. Alternatively, a signal can be large when measured in relation to an input signal level required to generate a particular third order product. That is, a signal can be defined to be large if a two-tone intermodulation test produces a third order intermodulation distortion product that is a predetermined level below the output signal, for example 40 dB. The definition of a large signal is relative to the signal distribution system in which a device is used and the previous definitions are not exhaustive.

Conversely, when the signal is small, the uncorrelated noise level may dominate the determination of SNR. Because an attenuator typically degrades signal power and may not degrade the uncorrelated noise power by an equivalent amount, the SNR following the attenuator can degrade. The placement of a passive device can also affect the amount of SNR degradation contributed by the device. Attenuators placed where the signal is large may not affect the SNR while identical attenuators placed where the signal is small may significantly degrade the SNR.

Thus, there exists an optimum signal range that maximizes SNR in the system. The optimum depends on the precise signal distribution system and the nature of the information signal distributed. The Automatic Gain Control (AGC) amplifier that is detailed below can help the system maintain the optimal operating range and thus help to maintain an optimum SNR in the system. The AGC amplifier can diminish the effects that subsequent distribution devices have on the SNR at the set top boxes 152, 154, and 156. Additionally, the AGC amplifier can minimize adverse effects of adding or removing distribution paths in the signal distribution system 100. The AGC amplifier can, for example, be integrated into the distribution switch 130 or signal splitter 170.

FIGS. 2A through 2D are functional block diagrams of AGC amplifiers that can be, for example, integrated into the distribution switch 130 and/or signal splitter 170 of FIG. 1. The AGC amplifier can also be implemented in an intermediate signal processing device, such as the signal splitter 170 or some other signal distribution device, alternatively referred to as a distribution device or signal processing device. Typically, the AGC amplifiers are not added as stand alone devices, but are implemented in conjunction with other distribution devices.

In some embodiments, intermediate signal distribution devices may not include AGC amplifiers. Such intermediate signal processing devices lacking an AGC amplifier may be configured for use in particular locations within the signal distribution system. In other embodiments, the intermediate signal distribution devices can, for example, include an AGC amplifier as the initial signal processing element.

Implementing an AGC amplifier with a signal distribution device allows the performance of the signal distribution system 100 to be substantially unaffected by the physical location of the signal distribution device. That is, the performance of the signal distribution system 100 is substantially indifferent to the placement of a signal distribution device at the front end of a cable run or at the back end of the cable run.

Implementing the AGC amplifier in the distribution device 130 immediately following the low noise block 126 can compensate for gain variations in the low noise block 126. Thus, embodiments implementing the distribution device 130 and low noise block 126 locally or in a single housing may advantageously eliminate a production adjustment of the low noise block 126 gain. Thus, the AGC function implemented in the distribution block 130 can provide a lowered production cost by eliminating a production tuning step.

Each of the AGC amplifier embodiments shown in FIGS. 2A through 2D can be implemented with a signal distribution device as an integrated circuit, as discrete devices, or as a combination of integrated circuits and discrete devices. An integrated circuit can, for example, incorporate multiple independent AGC amplifiers in parallel, with each AGC amplifier controlling the power of a signal received from a satellite downlink. The integrated circuit can be manufactured on a variety of substrate materials such as silicon, germanium, gallium arsenide, indium phosphide, sapphire, diamond, and the like, or any other suitable substrate material. Additionally, the AGC amplifier embodiments can be manufactured using a variety of manufacturing techniques including bipolar, FET, BiCMOS, CMOS, SiGe, and the like.

Figure 2B:
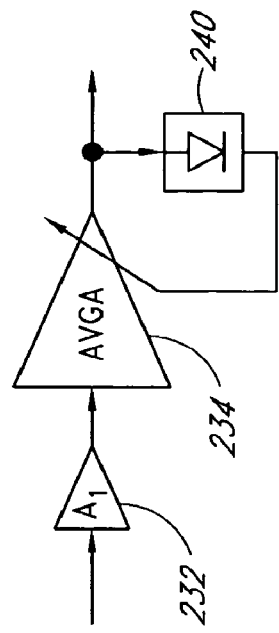
FIGS. 2A-2D are finctional block diagrams of AGC amplifiers.
Figure 2D:
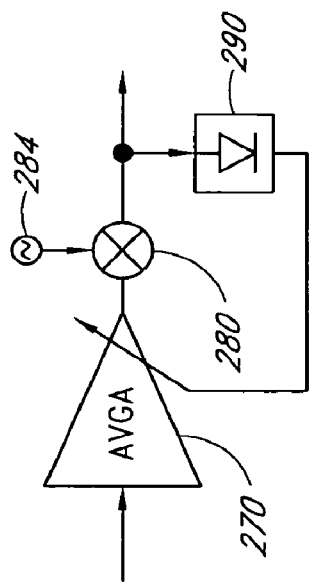
Figure 2A:
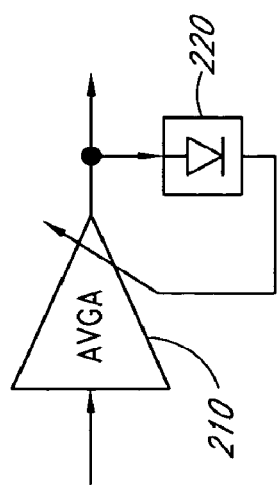

FIG. 2A is a finctional block diagram of a first AGC amplifier embodiment. The AGC amplifier includes a variable gain amplifier (VGA) 210 and a detector 220 connected to the output of the VGA 210. An output of the detector 220 is connected to a gain control input of the VGA 210 to control the gain of the amplifier.

The AGC amplifier implements an output referred AGC function to attempt to maintain the output power of the power amplifier at a predetermined optimal level, also referred to as the AGC set point. The AGC function is a process that attempts to maintain a signal power at the AGC setpoint. The AGC function increases the gain of the amplifier 210 when the output signal is below the AGC set point. The AGC function can continue to increase the gain of the VGA 210 as required, up to a maximum gain value. The VGA 210 continues to provide the maximum gain value as long as the output signal power remains below the AGC set point.

Conversely, the AGC function decreases the gain of the VGA 210 when the output signal power is above the AGC set point. The AGC function can continue to decrease the gain of the VGA 210 as required, down to a minimum value. The AGC function continues to provide the minimum gain value as long as the output signal power remains greater than the AGC set point.

Within a system such as the signal distribution system 100 of FIG. 1, there is typically a limit of input signal range. That is, the input to the signal distribution system 100 typically falls within a predetermined range. In such a system, it is possible to configure the AGC range such that one or more of the AGC limits is not ever reached. For example, the input signal from the satellite 110 may vary over a predetermined range. If the AGC amplifier in the distribution switch 130 or signal splitter 170 has an AGC range that is greater than the input signal range, the AGC function may never reach its limits.

Initially, an input signal having an input signal power, Pin, is provided to the input 215 of the VGA 210. The control signal provided to the VGA 210 can initially be set to control the VGA 210 to provide the maximum available gain, Gmax. The VGA 210 then provides an output signal having an output power, Pout, substantially equal to Pin+Gmax, for example, measured in terms of decibels relative to a milliwatt (dBm).

The output from the VGA 210 is connected to an input of a power detector 220. The power detector 220 measures the output signal power and generates a control signal that can correlate with the output signal power. For example, the power detector 220 can be configured to provide an output voltage that correlates with a given power level. Alternatively, the power detector 220 can be configured to provide an output current that correlates with a given power level.

The power detector 220 can be configured to measure the power of the composite amplifier output signal, including desired signals, noise, and distortion. Such a power detector 220 can be a broadband detector and can detect a power level over a broad frequency band. Alternatively, the power detector 220 can measure the power of only a portion of the output power from the VGA 210. For example, the power detector 220 can measure the power in a predetermined bandwidth, where the predetermined bandwidth represents only a portion of the bandwidth of the signal output from the VGA 210. The predetermined bandwidth can, for example, be entirely within a desired signal bandwidth of the output from the VGA 210. Alternatively, the predetermined bandwidth can partially overlap or be exclusive of a desired signal bandwidth of the VGA 210 output.

The output of the power detector 220 is connected to a control input of the VGA 210. The AGC amplifier can be configured to provide an output referred AGC function. For example, the power detector 220 can detect an output power of the VGA 210. The power detector 210 can also include a comparator having an AGC setpoint coupled to one comparator input. The detected output power can be provided to the second input of the comparator and compared to a AGC setpoint. The output of the comparator can be filtered, for example using an integrator. The output of the integrator can be the detector output control signal that controls the gain of the amplifier.

For example, a high power signal, one that is greater than the AGC set point, at the input to the power detector 220 produces a control voltage. The control voltage value corresponds with an amplifier gain value that is smaller than the original gain value. The high power detector 220 output reduces the gain of the VGA 210 such that the power detected at the output of the VGA 210 is substantially equal to the AGC set point.

Although the VGA 210 is shown as an amplifier, the AGC function can be implemented with gain only, a combination of gain and attenuation, or attenuation only. Additionally, the VGA 210 can be implemented with multiple stages and multiple devices. For example, the VGA 210 can be configured as multiple cascaded variable gain amplifiers, or as amplifiers cascaded with variable attenuators, or as multiple variable gain amplifiers in parallel, and the like.

Additionally, the power detector 220 can be a diode detector, a crystal detector, and the like. The power detector 220 can be configured to sample mean power, peak power, RMS voltage, mean voltage, peak voltage, mean current, RMS current, peak current, or some other value correlated to signal level. The power detector can be a single device or can be constructed of multiple devices. As discussed above, the power detector 220 can include, for example, a detector, a comparator, and integrator, or some other signal conditioning block.

Although the power detector 220 is shown to provide an output referred AGC function, the power detector 220 can be configured detect the signal power at other locations, such as at the input of the VGA 210. The power detector 220 can be configured to detect the signal power at some other location that is remote from the VGA 210, such as at the input to a set top box of FIG. 1.

The actual AGC finction can be implemented using a variety of techniques, including feedback and feed-forward. Regardless of whether the AGC function is configured as output referred using feedback, or output referred using feed-forward techniques, the AGC function can operate to provide a substantially stable output level over an predetermined AGC range.

FIG. 2B is a finctional block diagram of an embodiment of an AGC amplifier. The AGC amplifier includes a constant gain amplifier 232 at the input to the AGC amplifier. The output of the constant gain amplifier 232 is connected to the input of a VGA 234. The output of the VGA 234 is connected to a power detector 240. The output signal from the power detector 240 is connected to the control input of the VGA 234 to control the gain of the VGA 234.

The AGC amplifier embodiment in FIG. 2B is similar to the embodiment of FIG. 2A except that a constant gain amplifier 232 is implemented before the VGA 234. The AGC amplifier of FIG. 2B operates effectively the same as the AGC amplifier of FIG. 2A. The gain of the constant gain amplifier 232 can set a lower limit on the gain of the AGC amplifier. However, the gain of the constant gain amplifier 232 can be negated by attenuation in the VGA 234 if the VGA is configured to provide attenuation. The constant gain amplifier 232 can be included in an AGC amplifier, for example, in order to provide a front end amplifier in the AGC amplifier having a low noise figure.

Figure 2C:
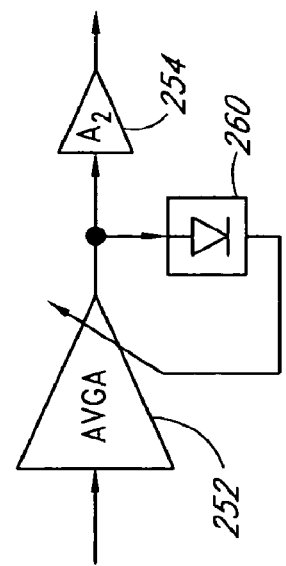

FIG. 2C is a finctional block diagram of another AGC amplifier embodiment. The AGC amplifier includes a VGA 252 at the input of the AGC amplifier. The output of the VGA 252 is connected to a constant gain amplifier 254. The output of the constant gain amplifier 254 is the output of the AGC amplifier. The output of the VGA 252 is also connected to the input of the power detector 260. The detected output is provided to the control input of the VGA 252. Thus, in the embodiment of FIG. 2C, the power detector 260 detects the power of an intermediate stage, rather than the input or output of the AGC amplifier. Of course, the embodiment of FIG. 2A can be modified to correspond to the embodiment of FIG. 2C by cascading the AGC amplifier with a constant gain amplifier. Although a constant gain amplifier 254 is implemented after the VGA 252, the composite AGC amplifier can be interpreted as being output referred.

FIG. 2D is another embodiment of an AGC amplifier. The AGC amplifier is an embodiment of a VGA coupled with a signal distribution device. The AGC amplifier includes a VGA 270 at the input of the AGC amplifier. The output of the VGA 270 is connected to the input of a mixer 280. A LO 284 drives an LO port of the mixer 280. The output of the mixer 280 is the output of the AGC amplifier. The output of the mixer 280 is also connected to the input of the power detector 290. The detected output is provided to the control input of the VGA 270.

In this AGC amplifier configuration, the AGC function is combined with band translation. The AGC amplifier power controls the output to track the AGC set point and can also frequency convert the signal from an input frequency band to an output frequency band. As noted earlier, a VGA such as 270 can be combined with a variety of signal distribution devices. The signal splitter 170 of FIG. 1 can represent another embodiment of a VGA coupled with a signal distribution device.

The VGA 270 operates in a manner as described above in relation to the other AGC amplifier embodiments. The output of the VGA 270 is connected to an input port of the mixer 280. The mixer 280 operates to frequency convert the signal from a first frequency band to a second frequency band. An LO 284, which can be a fixed frequency LO or a variable frequency LO, drives the LO port of the mixer 280. The mixer 280 provides an output signal that includes a frequency component that is at the sum of the input signal frequencies and the LO frequency and a frequency component that is at the difference of the input signal frequencies and the LO frequency.

The power detector 290 can be configured to detect signals within a predetermined frequency band. Thus, the power detector 290 can detect the signals in the desired frequency band while ignoring signals outside the frequency band of interest. The AGC amplifier can thus be configured to provide a controlled signal amplitude combined with a frequency conversion.

The benefits of including an AGC stage in the signal distribution system, such as within the distribution switch 130 or signal splitter 170 in the system of FIG. 1, can be illustrated with a comparison of an AGC signal distribution implementation with a fixed gain signal distribution implementation. FIGS. 3A and 3B show embodiments of cascaded amplifier configurations. The configuration in FIG. 3A includes fixed gain amplifiers while the configuration of FIG. 3B includes the AGC amplifiers. Such cascaded amplifier configurations can be included in the signal distribution switch of FIG. 1, for example, to provide three independent copies of a single input signal destined for three different geographic locations within the signal distribution system.

FIG. 3A is an embodiment of a fixed gain signal distribution section 300, such as a distribution section that can be implemented in the distribution switch of FIG. 1. For example, the devices in the distribution section 300 can be distributed at front end, intermediate location, or near a termination of a signal distribution system. The fixed gain distribution section 300 includes three gain devices 310, 320, and 330 connected in series. Each of the gain devices, for example 310, can be configured as an active power divider having a fixed gain of 0 dB, a noise figure (NF) of 3 dB, and an input third order intercept point (IIP3) of +30 dBm. Alternatively, each of the gain devices can include an amplifier in conjunction with some other type of signal distribution device.

A first fixed gain device 310 includes a fixed gain amplifier 312 followed by a passive power divider 314 having a first output 318a and a second output 318b. The composite gain through the fixed gain amplifier 312 and passive power divider 314 to one of the outputs, for example 318b, can be configured to be 0 dB. The second output 318a of the first fixed gain device 310 is connected to the input of a second fixed gain device 320. The second fixed gain device 320 also contains a fixed gain amplifier 322 and a passive power divider 324 having a first output 328a and a second output 328b. The second output 328b of the second fixed gain device 320 is connected to the input of a third fixed gain device 330. The third fixed gain device 330 is similarly configured with a fixed gain amplifier 332 followed by a passive power divider 334 having two outputs 338a, 338b.

An alternative signal distribution section 350 including AGC amplifiers is shown in FIG. 3B. The embodiment of the signal distribution section 350, including the AGC amplifiers, can be implemented in the distribution switch of FIG. 1.

Three gain devices, 360, 370, and 380 are cascaded in the signal distribution section. Each of the gain devices 360, 370, and 380 includes an AGC amplifier followed by a passive power divider. Each of the gain devices, 360, 370, and 380 may also include an AGC amplifier in conjunction with one or more other signal distribution devices.

Each of the gain devices, for example 360, can have an output referred AGC function with an AGC set point of 0 dBm, an IIP3 of +30 dBm, and a NF of 3 dB at 0 dB of gain. The gain device, for example 360, can have a gain range of from −20 dB to +20 dB. Each of the AGC amplifiers can be, for example, one of the AGC amplifier configurations shown in FIGS. 2A-2C.

An input signal is provided to an input of the first gain device 360. The input signal is coupled to the input of an AGC amplifier 362. The output of the AGC amplifier 362 is connected to the input of a power detector 364. The output of the power detector 364 is connected to a control input of the AGC amplifier. The output of the AGC amplifier 362 is also connected to the input of a power divider 366 that has first and second outputs, 368a and 368b respectively.

The second output 368b of the first gain device 360 is connected to the input of a second gain device 370. The output from the first gain device 360 is coupled to the input of an AGC amplifier 372. The output of the AGC amplifier 372 is connected to the input of a power detector 374. The output of the power detector 374 is connected to a control input of the AGC amplifier. The output of the AGC amplifier 372 is also connected to the input of a power divider 376 that has first and second outputs, 378a and 378b respectively.

The second output 378b of the second gain device 370 is connected to the input of a third gain device 380. The output from the second gain device 370 is coupled to the input of an AGC amplifier 382 in the third gain device 380. The output of the AGC amplifier 382 is connected to the input of a power detector 384. The output of the power detector 384 is connected to a control input of the AGC amplifier. The output of the AGC amplifier 382 is also connected to the input of a power divider 386 that has first and second outputs, 388a and 388b respectively.

The performance of the fixed gain distribution section 300 can be compared against the performance of the variable gain distribution section 350 for two operating conditions. In the first operating condition, the input signal is relatively small and uncorrelated noise is a significant factor limiting the SNR. In the second operating condition, the input signal is relatively large, and distortion products are significant factors limiting the SNR.

In the first operating condition, the input signal is relatively small. The configuration of the fixed gain distribution section 300 does not change. However, the variable gain distribution section 350 automatically configures itself to provide gain, up to a maximum gain level.

An active device, such as an amplifier, typically has multiple noise sources associated with it. The noise contribution of cascaded amplifiers can be reduced if the front end device has significant gain. The noise contribution of subsequent stages can become insignificant, and thus, the degradation to SNR can be minimized. Additionally, other noise contributors after the first gain stage, or front end device, degrade the SNR less than without the front end gain device. Thus, including the front end gain stage reduces the overall system SNR degradation. The performance of the fixed gain distribution section 300 can be compared to the variable gain distribution section 350 by examining the noise figures. The noise figure in a cascaded system is given by the following formula:

$$nf_{cascade} = nf_1 + \sum_{i=2}^{N} \frac{nf_i - 1}{\prod_{j=1}^{i-1} A_j},$$

where $N$ = number of stages, $A_j$ = gain of $j$th stage

The noise figure values in the formula are given as ratios, while noise figure specified for the devices are given in dB. Thus, the NF for the gain devices, for example 310 or 370, needs to be converted from decibels to ratios before application of the formula. Table 1 provides a summary of the cascaded noise figures for the two gain distribution sections, 300, 350. Psig represents the signal power, in dBm at either the input or output of the gain devices. The gain of the elements is provided in dB. The noise figure, in dB, is provided for each gain device and the corresponding cascaded noise figure, in dB, is provided at the output of each gain device.

TABLE 1

| Fixed Gain Distribution Section | | | | | | | |
|---|---|---|---|---|---|---|---|
| Psig (dBm) | −20 | — | −20 | — | −20 | — | −20 |
| Gain (dB) | | 0 | | 0 | | 0 | |
| NF (dB) | | 3 | | 3 | | 3 | |
| NFtot (dB) | | 3 | | 4.8 | | 6 | |
| Variable Gain Distribution Section | | | | | | | |
| Psig (dBm) | −20 | — | 0 | — | 0 | — | 0 |
| Gain (dB) | | 20 | | 0 | | 0 | |
| NF (dB) | | 3 | | 3 | | 3 | |
| NFtot (dB) | | 3 | | 3.02 | | 3.04 | |

Thus, it can be seen that the ability of the variable gain distribution section 350 to include gain in an initial amplifier section results in greatly reduced signal degradation due to noise contributed by subsequent stages when compared to the fixed gain distribution section 300. Noise contributors after the initial gain section degrade the SNR less than without the gain section. Therefore, overall system degradation of SNR can be reduced with the inclusion of an initial gain section.

In the second operating condition, the input signal is relatively large. The configuration of the fixed gain distribution section 300 does not change. However, the variable gain distribution section 350 automatically configures itself to provide attenuation, up to a maximum attenuation level. When input signal levels are relatively large, distortion components, such as third order intermodulation distortion products, can be the dominant factor in degrading SNR. A cascaded IIP3 for the signal distribution sections, 300, 350 can be calculated and compared to illustrate the advantages of variable gain distribution over fixed gain distribution. The cascaded IIP3 of a gain section is given by the formula:

$$\frac{1}{IP_{tot}} = \frac{1}{IP3_1} + \sum_{i=2}^{N} \frac{\prod_{j=1}^{i-1} A_j}{IP3_i}$$

The IP3 values in the formula are the linear terms and are not the values in dBm. Similarly, the gain values are provided as ratios and are not in dB. Table 2 provides a summary of the cascaded IIP3 for the two gain distribution sections 300, 350. Psig represents the signal power, in dBm at either the input or output of the gain devices. The gain of the elements is provided in dB. The IIP3, in dBm, is provided for each gain device and the corresponding cascaded IIP3, in dBm, is provided at the output of each gain device.

TABLE 2

| Fixed Gain Distribution Section | | | | |
|---|---|---|---|---|
| Psig (dBm) | +20 | +20 | +20 | +20 |
| Gain (dB) | | 0 | 0 | 0 |
| IIP3 (dBm) | | +30 | +30 | +30 |
| IIP3tot (dBm) | | +30 | +27 | +25.2 |
| Variable Gain Distribution Section | | | | |
| Psig (dBm) | +20 | 0 | 0 | 0 |
| Gain (dB) | | −20 | 0 | 0 |
| IIP3 (dBm) | | +30 | +30 | +30 |
| IIP3tot (dBm) | | +30 | +29.96 | +29.91 |

Thus, it can be seen that the ability of the variable gain distribution section 350 to include attenuation in an initial amplifier section results in greatly reduced signal degradation due to noise contributed by subsequent stages when compared to the fixed gain distribution section 300. Distortion contributors after the initial attenuation stage degrade the SNR less than without the attenuation stage. The overall system degradation of SNR can be reduced with the inclusion of an initial attenuation section.

The inclusion of an AGC function in a signal distribution section can thus improve the quality of the signal compared to a fixed gain configuration. The advantages of the variable gain section over the fixed gain section under the extreme conditions of low input signal power and high input signal power show that the variable gain distribution section has flexibility as to its position within a signal distribution system. The variable gain distribution section need not be placed at the front end or as a final stage in a signal distribution system.

Figure 4:
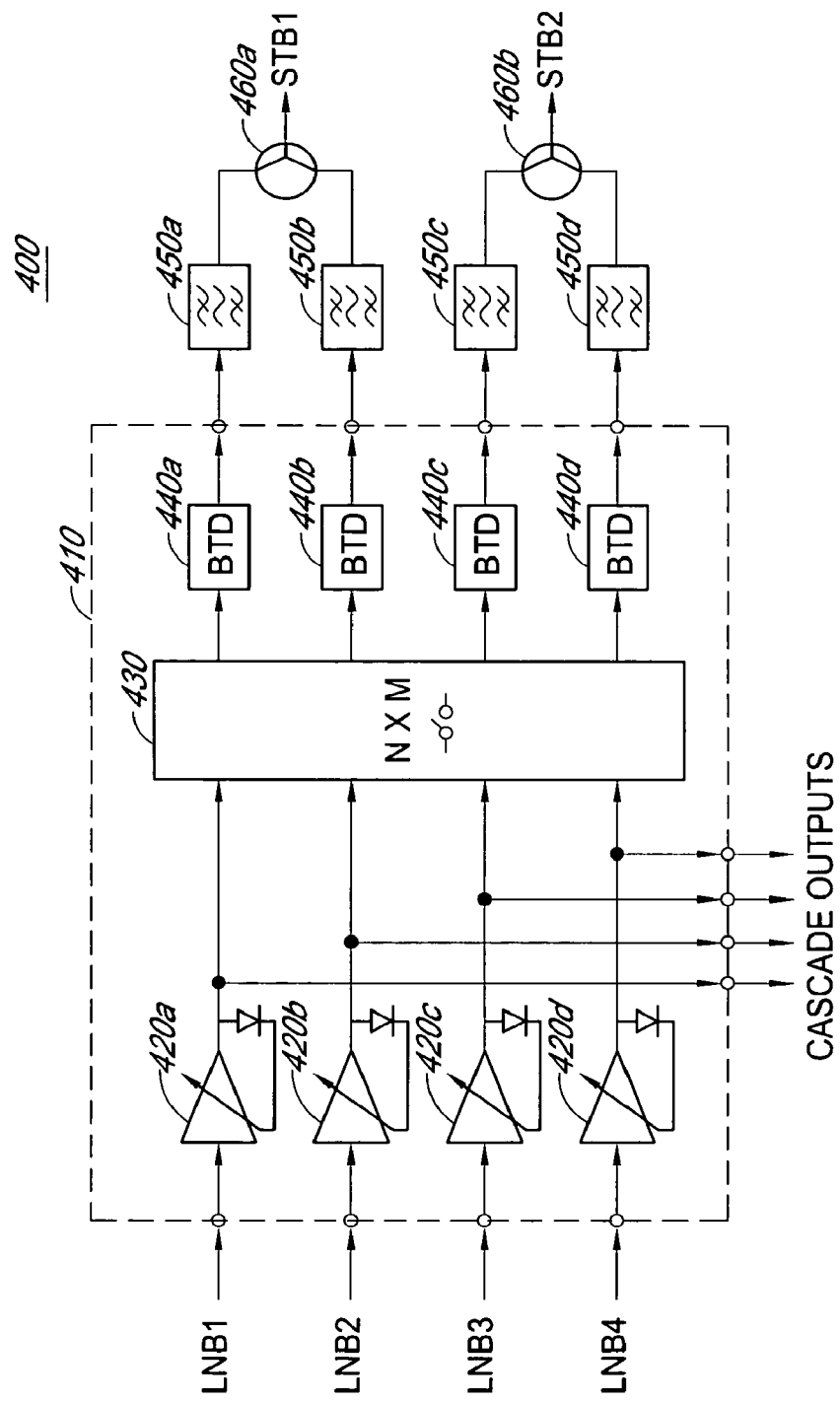
FIG. 4 is a functional block diagram of an integrated band translation switch interfacing with additional components to provide two signal outputs.

FIG. 4 is a finctional block diagram of a specific embodiment of signal distribution system 400 including an integrated crosspoint switch with band translation (band translation switch) 410 and external components. The band translation switch 410 includes four inputs for LNB's, a cascadable output corresponding to each of the inputs, and two outputs configured to interface with set top boxes. The band translation switch 410 is configured to interface with LNB's signals having a dual band-stacked frequency plan. The dual band-stacked frequency plan includes an upper band block and a lower band block. The band translation switch outputs maintain the dual band-stacked frequency plan, but allow the upper or lower band block from any of the LNB signals to be configured as an output upper band block. Similarly, the upper or low band block from any of the LNB signals can be configured as an output lower band block. A more detailed description of the band translation switch 410 is provided below.

The band translation switch 410 includes four inputs configured to interface with up to four LNB's. Each LNB provides a signal conforming to a dual band-stacking frequency plan having an upper band block and a lower band block. For example, the LNB signals can be satellite downlink signals from selected transponder groups. The lower band block can be 950-1450 MHz and the upper band block can be 1650-2150 MHz.

Each of the signal inputs is connected to the input of an amplifier 420a-420d. The amplifiers 420a-420d are configured as Low Noise Amplifiers (LNA's) that both buffer and amplify the input signals from the LNB's. The output from each of the amplifiers 420a-420d is connected to a corresponding input on a crosspoint switch 430. Additionally, the output from each of the amplifiers 420a-420d is connected to a corresponding cascade output of the band translation switch 410.

The crosspoint switch 430 is configured as a 4×4 switch. Any of the four amplified LNB input signals can be selectively routed to any of the four outputs of the crosspoint switch 430 independently and simultaneously. For example, the crosspoint switch 430 can include a two-bit control for each output. The value of the two-bit control can be programmed to selectively route the signal from one of the four inputs. The band translation switch 410 can, for example, receive the two bit control words from a set top box. Alternatively, the set top box may send one or more control messages to a microprocessor implemented local to the crosspoint switch and the microprocessor can generate the one or more two bit control words. In the embodiment shown in FIG. 4, each of the four outputs from the crosspoint switch 430 is connected to a band translation device 440a-440d. One or more outputs from the crosspoint switch 430 can be coupled to the same band translation device, for example 440a.

The band translation devices 440a-440d are configured to selectively frequency translate the signals or to pass the signals without frequency translation. Each of the band translation devices 440a-440d can select frequency translation or pass through independently of the other devices. Because a dual band-stacked frequency plan is used in this embodiment, the band translation devices 440a-440d are configured to swap the positions of the upper and lower band blocks when frequency translation is selected.

Each of the band translation devices 440a-440d includes a mixer. The band translation switch 410 also includes one or more local oscillators (LO). In one embodiment with a dual band-stacked frequency plan, a single LO can be routed to all of the band translation devices 440a-440d. In another embodiment, the local oscillator frequency can be fixed when a dual band-stacked frequency plan is implemented. An LO frequency of 3.1 GHz, or 2× (the band center mean), can be used to perform the frequency translation.

In another embodiment, a plurality of variable frequency LOs can be used with the band translation devices 440a-440d. For example, each of the band translation devices 440a-440d can have a separate independently controlled LO output frequencies. Thus, each of the band translation devices 440a-440d can frequency translate its input signal independently of the frequency translation performed by any other band translation device.

LO buffer amplifiers (not shown) distribute the signal from the LO output to each of the band translation devices 440a-440d. The output of the band translation devices 440a-440d are connected to the outputs of the band translation switch 410.

Each of the outputs of the band translation switch 410 is a dual band-stacked signal. Each of the outputs of the band translation switch 410 is connected to a filter 450a-450d. The filters 450a-450d are configured to pass signals in one of the predetermined frequency bands in the dual band-stacked frequency plan. The filters 450a-450d reject signals outside of the passband, including the signals at the undesired frequency band. The filters 450a-450d can be configured with tunable passbands or can be configured to have fixed passbands.

In the present embodiment, the filters 450a-450d are configured as bandpass filters with fixed passbands. The first filter 450a is configured as a bandpass filter that passes the upper band block of the frequency plan. A second filter 450b is configured as a bandpass filter that passes the lower band block. Similarly, a third filter 450c is configured to pass the upper band block and a fourth filter 450d is configured to pass the lower band block. The outputs of the first and second filters 450a-450b are connected to respective first and second inputs of a first signal combiner 460a. Similarly, the outputs of the third and fourth filters 450c-450d are connected to first and second inputs of a second signal combiner 460b. The filters 450a-450d are not limited to bandpass filters, but can be, for example, bandpass filters (BPF), lowpass filters (LPF) or highpass filters (HPF). In other embodiments, other frequency selective devices can be used to limit the frequency response of the outputs. The filters 450a-450d can have passbands that are narrower than the frequency bandwidth of the input signals. For example, an input to a filter, for example 450a, can include multiple carriers. However, the filter 450a can be configured to pass a subset of all of the carriers.

The signal combiners 460a-460b are configured to sum the signals provided at their inputs and to provide the summed signal at an output. The outputs from the signal combiners 460a-460b are the band translated outputs of the signal distribution system 400. Each of the outputs is connected to a set top box for further processing and for distribution to an end user device.

As discussed above, one or more frequency selective devices can be used as the filters 450a-450d. For example, a diplexer can be used to filter and to band-stack signals. The diplexer can be used as the filters, for example 450a and 450b, and signal combiner 460a.

Of course, the band translation switch 410 is not limited to operating with band stacked input signals. For example, each of the LNB's can provide signals in the same frequency band. The band translation switch 410 can be configured to frequency translate and combine portions of the single band input signals. The crosspoint switch 430 can, for example, route the output of the first amplifier 420a to a first band translation device 440a. An LO in the first band translation device 440a can be configured to frequency translate the signal such that one or more channels from the input signal are translated to desired output frequencies. The first filter 450a can be configured to pass only those desired channels and reject all undesired frequencies and channels.

Similarly, the crosspoint switch 430 can be configured to route the output of the second amplifier 420b to a second band translation device 440b. The second band translation device 440b can be configured to frequency translate a portion of the input signal to desired output frequencies. The second filter 450b can be configured to pass only those desired channels and reject all undesired frequencies and channels.

The first and second band translation devices 440a-440b in conjunction with the first and second filters 450a-450b can be configured to produce selected channels in mutually exclusive frequency bands. The combiner 460a can then sum the filtered outputs to produce a composite output signal from independent single band input signals, where each filter includes one or more channels. In one embodiment of the single band input signal configuration, each band translation device and filter pair, for example 440a and 450a, is configured to frequency translate one or more channels from each of one or more input signal bands. The frequency translated signals can be combined into a single band signal or a multiple band signal.

Similarly, some embodiments can have multiple band translation devices and multiple filters. Each of the multiple band translation devices can frequency translate one or more channels from one or more input bands. The outputs of the multiple filters can be summed to provide a single composite signal having a desired channel line up.

One embodiment of the band translation switch 410 can be used in a signal distribution system designed to provide distribution of satellite television signals in a residence. The AGC amplifiers 420a-420d provide variable gain and attenuation based on the power of the input signal. The measurement point for the AGC function is at the output of the AGC amplifiers 420a-420d and the gain of the crosspoint switch 430 and the band translation devices 440a-440d are fixed.

Each AGC amplifier 420a-420d followed by a crosspoint switch 430, band translation device 440a-440d, filter 450a-450d, and signal combiner 460a-460b can be configured to provide a total gain that ranges from a minimum of −7 dB to a maximum of +7 dB. The corresponding NF of a path through the band translation switch 410 from the AGC amplifier, for example 420a, through to the output of a band translation device, for example 440a, can vary from, for example, a high of 24 dB to a low of 10 dB. The signal path experiences a higher NF when providing attenuation and has a lower NF when the gain is unity or greater. Similarly, the IIP3 associated with the signal path can range from a minimum of −7 dBm to a maximum of +7 dBm. For example, the IIP3 of the signal path can be −15, −10, −7, −6, −5, −4, −3, −2, −1, 0, +1, +2, +3, +4, +5, +6, +7, +10, +15, +20, +25, or +30 dBm.

The IIP3 of the AGC amplifier 420a is typically higher when the amplifier is configured to provide attenuation, which contributes to the composite IIP3 of the signal path. The IIP3 of the AGC amplifier 420a can vary in proportion to the gain of the amplifier.

Because the AGC amplifier 420a also provides the signal to a cascade output, the characteristics of the AGC function at the cascade output are substantially the same as the characteristics of the AGC amplifier 420a. Also because the AGC function is provided before the cascade output, the benefits of the AGC function are experienced in the main signal path as well as the signal path through the cascade output.

This band translation switch 410 configuration can be used in a signal distribution system where the input to the band translation switch 410 can be expected to vary over the range of −50 dBm through −10 dBm. The AGC amplifiers 420a-420d can be configured to have an output referred AGC setpoint of −17 dBm, where the output refers to the output signal of the switch 400. The band translation switch 410 need not actually measure the power at the output of the switch 400. Because the devices following the band translation switch 410 have fixed gains, the AGC output can be interpreted as being output referred to any point past an AGC amplifier where the gain or attenuation is fixed.

Using this AGC setpoint, the AGC amplifier, for example 420a, provides a gain of 7 dB when the input signal is −24 dBm or below. Additionally, the AGC amplifier 420a provides −7 dB of gain, or 7 dB of attenuation, when the input signal is −10 dBm or greater. Thus, within the input power range of −24 dBm through −10 dBm the AGC amplifier 420a provides a constant output power of −17 dBm.

Figure 5:
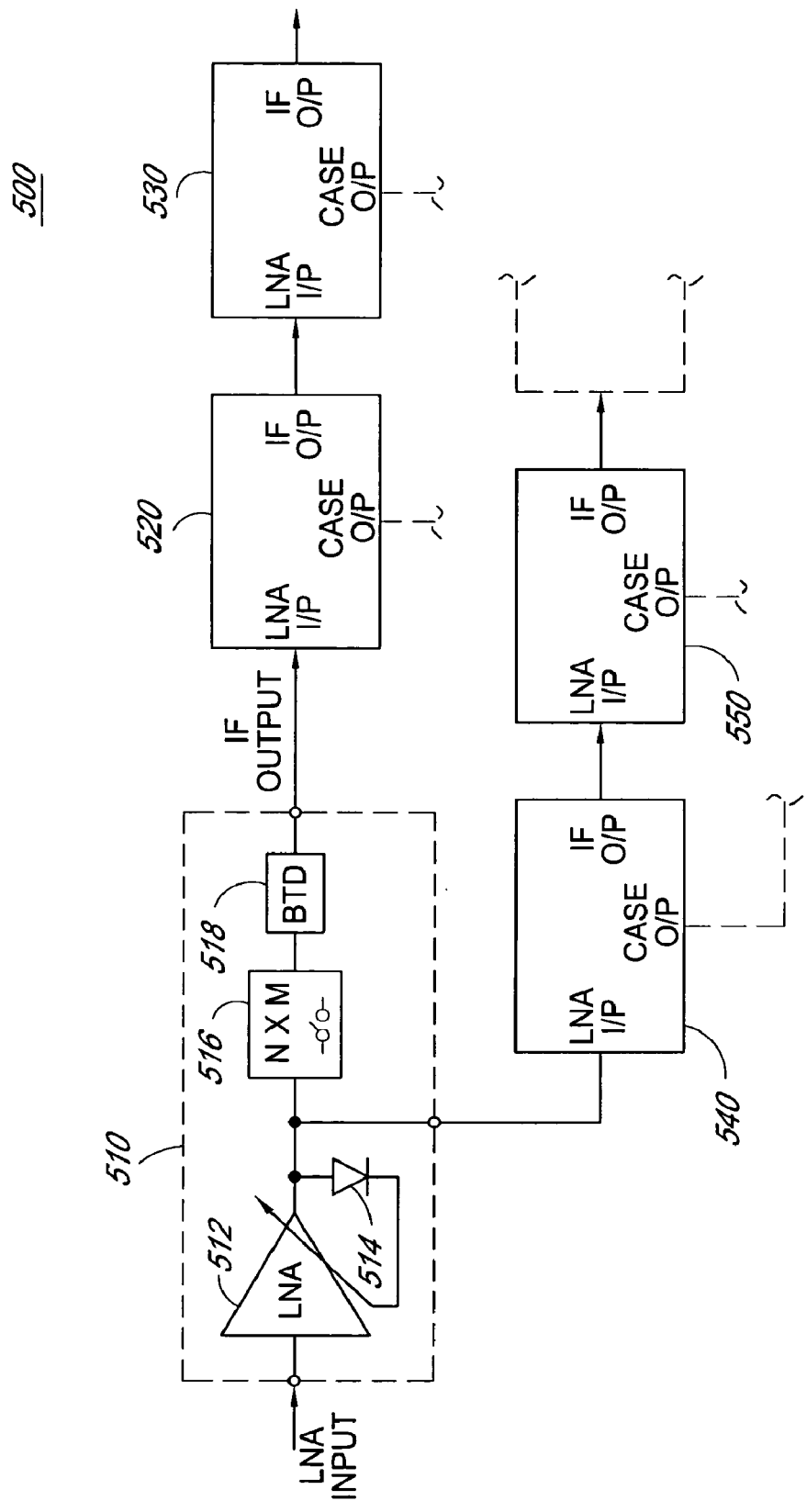
FIG. 5 is a finctional block diagram of cascaded integrated band translation switches.

FIG. 5 is a finctional block diagram of multiple band translation switches 510, 520, 530, 540, and 550, connected in a signal distribution system. The band translation switches 510, 520, 530, 540, and 550, can be configured with LNBs to provide the distribution switch of FIG. 1. However, as noted earlier, one or more of the band translation switches 510, 520, 530, 540, and 550 can be positioned at other locations within the signal distribution system. For example, one or more of the band translation devices can be positioned near the signal input, at an intermediate position within the signal distribution system, or near a termination or destination device of the signal distribution system.

A first band translation switch 510 includes an LNA input that can be connected to an LNB that block converts a satellite downlink transmission. The output of the first band translation switch 510 is connected to an input of a second band translation switch 520 that, in turn, has an output connected to a third bans translation switch 530. A cascade output of the first band translation switch 510 is connected to the input of a fourth band translation switch 540. The output of the fourth band translation switch 540 is connected to the input of a fifth band translation switch 550.

Each of the band translation switches, 510, 520, 530, 540, and 550, can be the band translation switch of FIG. 4 and can include one of the AGC amplifiers of FIGS. 2A-2C. Each of the band translation switches, 510, 520, 530, 540, and 550, can be configured similarly to the first band translation switch 510. In the first band translation switch 510, an input VGA 512 receives the input signal from the LNB's. []The VGA 512 typically has a low noise figure, such that the noise figure of the band translation switch 510 from the input to a band translation output is below 3 dB, 4 dB, 5 dB, 6 dB, 8 dB, 10 dB, 12 dB, 14 dB, 15 dB, 20 dB, 25 dB, 30 dB, 35 dB or 40 dB. The noise figure of the band translation switch 510 from an input to the cascade output is typically closer to the value of noise figure of the VGA 512 and can be, for example less than 3 dB, 4 dB, 5 dB, 6 dB, 8 dB, 9 dB, 10 dB, 12 dB, 14 dB, 15 dB, 20 dB, 24 dB, 25 dB, 30 dB, 35 dB or 40

Additionally, the VGA 512 contributes to the IIP3 of the band translation switch 510. The band translation switch 510 typically has an IIP3, measured from an input to an output of a band translation device, of greater than −40, −30, −20, −10, −8, −7, −6, −5, −4, −3, −2, −1, 0, +1, +2, +3, +4, +5, +6, +7, or +8, +15, +20, +22, +25, +26, +27, +28, +29, or +30 dBm. Similarly, the band translation switch 510 typically has an IIP3, measured from an input to the cascade output of greater than −10, −5, +1, +2, +3, +4, +5, +6, +7, +8, +9, +10, +15, +20, +25, or +30 dBm.

The output of the VGA 512 is connected to a detector 514 and N×M crosspoint switch 516. The detector 514 detects the power output by the VGA 512 and provides a detected output that is connected to the control input of the VGA 512. Additionally, the output of the VGA 512 drives the cascade output of the first band translation switch 510. The output of the N×M crosspoint switch 516 is connected to a band translation device 518.

Although only one VGA 512 and detector 514 are shown in the first band translation switch 510, more than one VGA 512 and cascade output can be included in a band translation switch, as shown in FIG. 4. Thus, the benefits of having an AGC function in line with a signal distribution path can be provided to two signal paths originating from a single VGA, for example 512, in a single band translation switch, 510.

Each of the subsequent band translation switches 520, 530, 540 and 550, can also be connected to signal paths at their cascade outputs and can likewise control the signal level and minimize the subsequent noise contributions by utilizing an input AGC stage. The fourth band translation switch 540 connected to a cascade output of the first band translation switch 510 does not contribute noise to the originating signal path and further controls noise contributions from subsequent stages.

Figure 6:
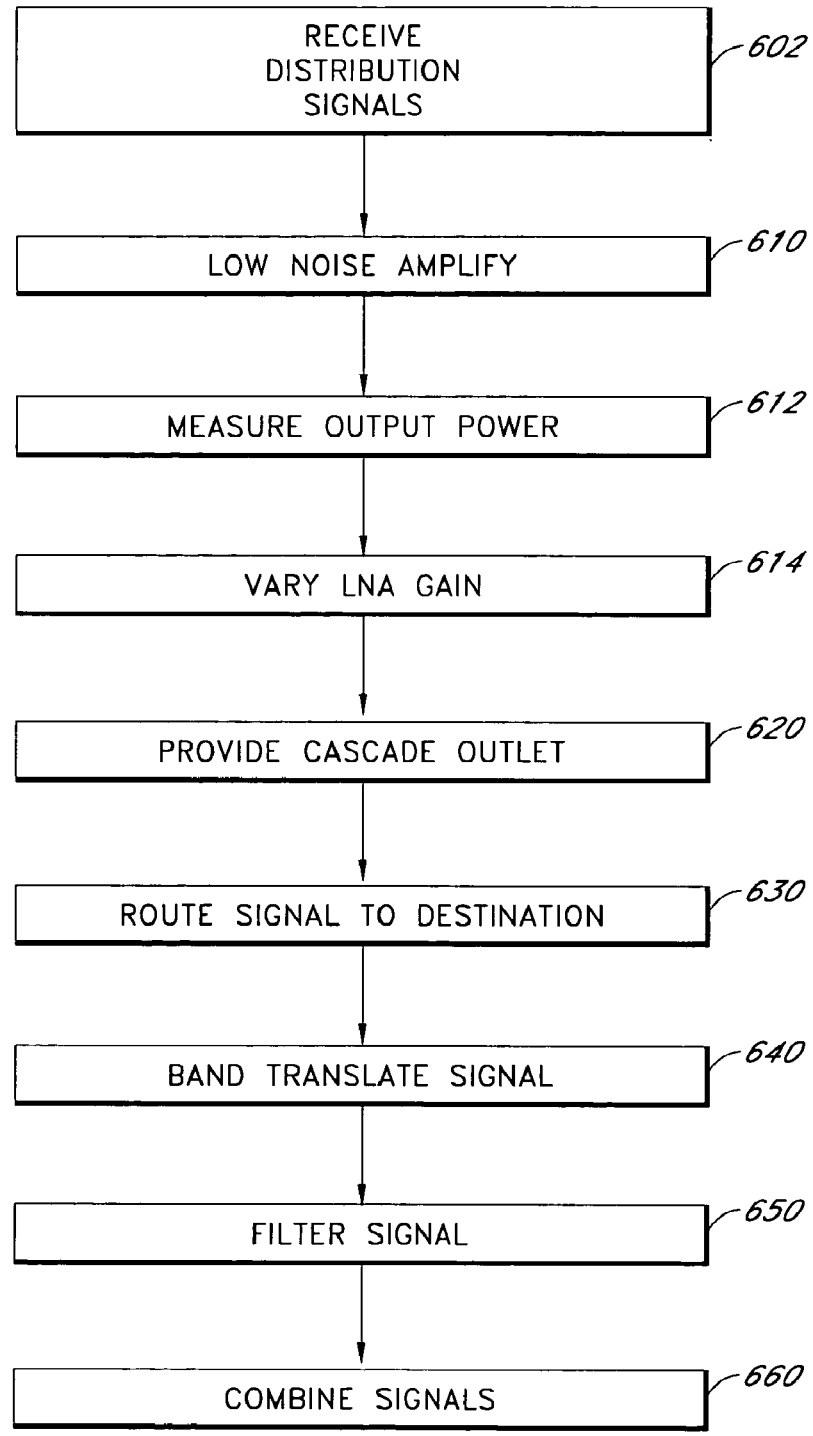
FIG. 6 is a flowchart of a method of distributing signals using cascadable AGC amplifiers.

FIG. 6 is a flowchart of a signal distribution method 600 for use in a signal communication system, such as the satellite communication system shown in FIG. 1. The method 600 begins at block 602 where the distribution signals are received. The signals can be received from a satellite, as in FIG. 1, or can be received from an antenna configured to receive terrestrial signals, a cable, or an optical link. Additionally, the signals can be received from a combination of sources.

After receiving the signals to be distributed, the signals are amplified, typically by a low noise amplifier, as shown in block 610. Because the gain can be varied from a positive gain value to a negative value, the amplifier may not be a low noise amplifier under all operating conditions and can be an attenuator under some operating conditions. In this context, a negative gain value refers to attenuation.

After amplification, the output power is measured, block 612. Because output power is measured after the gain stage, the subsequent AGC function based on the measured output power can be referred to as output referred AGC. The measured output power is then used as a factor for varying the gain, block 614. As previously discussed, the gain can typically be varied over a range spanning positive gain to attenuation.

A cascade output is also provided, block 620, and can be provided after the AGC function. The gain controlled signal can be provided as a cascade output, as is shown in FIGS. 4 and 5.

Additionally, the signal is routed to a destination path, block 630, such as by the N×M crosspoint switch shown in FIG. 4. The signal that is routed to the destination by the N×M crosspoint switch is typically independent of the signal provided to the cascade output. Thus, as is shown in the band translation switch of FIG. 4, the output of the AGC section is provided as a cascade output and is also provided to the input of the N×M crosspoint switch to be routed to one of M possible distribution paths.

The signal that is routed to a distribution path can then be band translated, block 640. A band translation block can include a mixer to selectively translate the signal from a first frequency block to a second frequency block. Additionally, the band translation block can be configured to have a pass through path where the signal is not frequency translated.

Following band translation, the signal output from the band translation block can be filtered, block 650, to remove noise and unwanted frequency components that are outside of a band of interest. Two or more of the filtered signals can be combined to produce a composite signal, block 660. The two or more filtered signals can originate from one or more independent signal distribution paths. Each of the filtered signals can be in a distinct frequency band. Alternatively, one or more of the filtered signals can be in a frequency band that overlaps the frequency band of another of the filtered signals.

Although the method 600 is shown with flow from one block to the next, the order of the method blocks is not limited to the order shown in FIG. 6.

The discussion provided above describes an AGC amplifier in conjunction with a signal distribution device and method of signal distribution using AGC in conjunction with a signal distribution device. The AGC amplifier in combination with a signal distribution device allows for insertion of in-line cascadable devices without significantly degrading the system SNR. The AGC amplifier can also include a cascade output to allow for creation of additional signal distribution paths without the additional path significantly degrading the performance of the signal path from which it branches and/or the signal path it feeds. The cascade output can be used to provide the AGC function without the subsequent signal distribution function. This may be particularly advantageous, for example, when the signal distribution function is a band translation function.

The AGC amplifier in combination with a signal distribution device can be inserted as an in-line device that minimizes degradation of system SNR regardless of its location within the signal distribution system. An output referred AGC function is used to keep output power relatively constant over an input operating range in order to maintain an optimal signal operating range within the distribution system.

Electrical connections, couplings, and connections have been described with respect to various devices or elements. The connections and couplings can be direct or indirect. A connection between a first and second device can be a direct connection or can be an indirect connection. An indirect connection can include interposed elements that can process the signals from the first device to the second device.

Those of skill in the art will understand that information and signals can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the invention. Various modifications to these embodiments will be readily apparent to those skilled in the art, and the generic principles defined herein can be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. An apparatus comprising:
   a) at least one variable gain amplifier having an output;
   b) a first crosspoint switch having a plurality of first crosspoint switch inputs and a plurality of first crosspoint switch outputs, each of the first crosspoint switch inputs coupled to the output of a respective one of the variable gain amplifiers, the first crosspoint switch operable to switchably couple any of the plurality of first crosspoint switch inputs to any one or more of the plurality of first crosspoint switch outputs;
   c) at least one frequency translation device having an input coupled to a respective first crosspoint switch output;
   d) a second crosspoint switch having a plurality of inputs and a plurality of outputs operable to switchably couple any of the plurality of second crosspoint switch inputs to any one or more of the plurality of second crosspoint switch outputs, the second crosspoint switch inputs each being coupled to a respective input of the first crosspoint switch;
   e) a second plurality of variable gain amplifiers having inputs and outputs, each input coupled to a respective output of the second crosspoint switch; and
   f) a second plurality of frequency translation devices having inputs, each input coupled to a respective output of one of the second plurality of variable gain amplifiers.

2. An apparatus comprising: a) at least one variable gain amplifier having an output; b) a first crosspoint switch having a plurality of first crosspoint switch inputs and a plurality of first crosspoint switch outputs, each of the first crosspoint switch inputs coupled to the output of a respective one of the variable gain amplifiers, the first crosspoint switch operable to switchably couple any of the plurality of first crosspoint switch inputs to any one or more of the plurality of first crosspoint switch outputs; c) at least one frequency translation device having an input coupled to a respective first crosspoint switch output;

a second crosspoint switch having a plurality of inputs and a plurality of outputs operable to switchably couple any of the plurality of second crosspoint switch inputs to any one or more of the plurality of second crosspoint switch outputs;

a second plurality of variable gain amplifiers having inputs and outputs, each output coupled to a respective input of the second crosspoint switch and the input of each variable gain amplifier coupled to a respective input of the first crosspoint switch;

a second plurality of frequency translation devices having inputs, each second frequency translation device input being coupled to a respective second crosspoint switch output.

3. The apparatus of claim 1, wherein:
   each one of the plurality of first crosspoint switch outputs is coupled to a single one of the plurality of first output devices, and
   each one of the plurality of second crosspoint switch outputs is coupled to a single one of the plurality of second output devices.

* * * * *